(12) United States Patent
Baldwin et al.

(10) Patent No.: US 12,671,237 B1
(45) Date of Patent: Jun. 30, 2026

(54) POWERED ELECTRICAL WALL PLATE WITH A TOUCH-SENSITIVE SURFACE

(71) Applicant: Titan3 Technology LLC, Tempe, AZ (US)

(72) Inventors: Jeffrey P. Baldwin, Anthem, AZ (US); John E. Klein, Chandler, AZ (US)

(73) Assignee: Titan3 Technology LLC, Tempe, AZ (US)

( * ) Notice: Subject to any disclaimer, the term of this patent is extended or adjusted under 35 U.S.C. 154(b) by 246 days.

(21) Appl. No.: 18/736,012

(22) Filed: Jun. 6, 2024

Related U.S. Application Data

(60) Provisional application No. 63/471,474, filed on Jun. 6, 2023.

(51) Int. Cl.
| | |
|---|---|
| *H02G 3/08* | (2006.01) |
| *F21S 8/00* | (2006.01) |
| *F21V 33/00* | (2006.01) |
| *H01R 13/74* | (2006.01) |
| *H01R 25/00* | (2006.01) |
| *H02G 3/14* | (2006.01) |
| *H03K 17/96* | (2006.01) |
| *H05B 47/11* | (2020.01) |
| *H05B 47/175* | (2020.01) |
| *H01R 13/621* | (2006.01) |

(52) U.S. Cl.
CPC .............. *H02G 3/081* (2013.01); *F21S 8/035* (2013.01); *F21V 33/006* (2013.01); *H01R 13/748* (2013.01); *H01R 25/006* (2013.01); *H02G 3/14* (2013.01); *H03K 17/962*

(2013.01); *H03K 17/964* (2013.01); *H03K 17/9645* (2013.01); *H05B 47/11* (2020.01); *H05B 47/196* (2024.01); *H01R 13/6215* (2013.01)

(58) Field of Classification Search
None
See application file for complete search history.

(56) References Cited

U.S. PATENT DOCUMENTS

| | | | |
|---|---|---|---|
| 3,522,595 | A | 8/1970 | White |
| 3,739,226 | A | 6/1973 | Seiter |
| 4,000,405 | A | 12/1976 | Horwinski |
| 4,484,185 | A | 11/1984 | Graves |
| 4,546,419 | A | 10/1985 | Johnson |
| 4,915,638 | A | 4/1990 | Domian |
| 5,481,442 | A | 1/1996 | Dickie |
| 5,964,516 | A | 10/1999 | Lai |
| 6,045,232 | A | 4/2000 | Buckmaster |

(Continued)

*Primary Examiner* — Krystal Robinson
(74) *Attorney, Agent, or Firm* — Kenneth C. Booth; Booth Udall, PLC

(57) ABSTRACT

A powered wall plate with a wall plate, an electrical circuit, at least one light, and a touch-sensitive control switch. The wall plate has at least two electrical plug prongs extending rearward from the wall plate that are configured to receive power from an electrical device. The electrical circuit is electrically coupled to the at least two electrical plug prongs. The at least one light is positioned on the wall plate and is electrically coupled to the electrical circuit. The touch-sensitive control switch is electrically coupled to the at least one light and is configured to control the supply of power from the electrical device to the at least one light. The touch-sensitive control switch is configured to respond when a user contacts the touch-sensitive control switch.

20 Claims, 10 Drawing Sheets

(56)         References Cited

U.S. PATENT DOCUMENTS

| | | | | |
|---|---|---|---|---|
| 6,883,927 | B2 | 4/2005 | Cunningham | |
| 7,247,793 | B2 | 7/2007 | Hinkson | |
| 7,874,717 | B1 | 1/2011 | Shaefer | |
| 8,304,652 | B2 | 11/2012 | McBain | |
| 8,393,747 | B2 | 3/2013 | Kevelos | |
| 8,399,765 | B1 | 3/2013 | Baldwin | |
| 8,668,347 | B2 * | 3/2014 | Ebeling | H05K 5/03 |
| | | | | 174/67 |
| 8,674,221 | B2 | 3/2014 | Yang | |
| 9,970,641 | B2 | 5/2018 | Mousavi | |
| 10,305,216 | B1 | 5/2019 | Shotey | |
| 10,381,788 | B2 * | 8/2019 | Smith | G05F 3/02 |
| 10,446,970 | B2 | 10/2019 | Shotey | |
| 10,644,465 | B2 | 5/2020 | O'Reilly | |
| 10,720,727 | B1 | 7/2020 | Shotey | |
| 11,489,298 | B2 * | 11/2022 | O'Reilly | H01H 9/0271 |
| 11,489,323 | B1 | 11/2022 | Baldwin | |
| 11,664,631 | B2 * | 5/2023 | Owen | H05B 47/115 |
| | | | | 340/500 |
| 11,778,302 | B1 * | 10/2023 | Baldwin | H04N 23/57 |
| | | | | 348/143 |

| | | | | |
|---|---|---|---|---|
| 2004/0142601 | A1 | 7/2004 | Luu | |
| 2006/0072302 | A1 * | 4/2006 | Chien | F21S 8/035 |
| | | | | 362/84 |
| 2006/0073731 | A1 | 4/2006 | Chien | |
| 2006/0198142 | A1 | 9/2006 | Dickie | |
| 2008/0068822 | A1 | 3/2008 | Spartano | |
| 2014/0054060 | A1 * | 2/2014 | Smith | H05K 5/03 |
| | | | | 174/66 |
| 2014/0140064 | A1 | 5/2014 | Trolese | |
| 2015/0256665 | A1 * | 9/2015 | Pera | H04L 12/2816 |
| | | | | 455/420 |
| 2015/0276178 | A1 | 10/2015 | Chien | |
| 2015/0340826 | A1 * | 11/2015 | Chien | F21V 33/00 |
| | | | | 439/490 |
| 2017/0222364 | A1 * | 8/2017 | Smith | H05B 47/11 |
| 2017/0356638 | A1 | 12/2017 | Mousavi | |
| 2018/0316145 | A1 | 11/2018 | Mckiernan | |
| 2019/0148891 | A1 * | 5/2019 | Smith | H01R 13/6675 |
| | | | | 174/66 |
| 2019/0229478 | A1 * | 7/2019 | Iaconis | H02G 3/12 |
| 2021/0348731 | A1 * | 11/2021 | McGovern | H05B 47/165 |
| 2023/0135355 | A1 * | 5/2023 | King | H01R 33/90 |
| | | | | 174/59 |

* cited by examiner

POWERED ELECTRICAL WALL PLATE WITH A TOUCH-SENSITIVE SURFACE

RELATED APPLICATIONS

This application is a continuation-in-part of U.S. Utility patent application Ser. No. 18/362,651, filed Jul. 31, 2023 to Jeffrey P. Baldwin, titled "Powered Wall Plate with Plug Prongs," which application is a continuation of U.S. Utility patent application Ser. No. 17/992,666 entitled "Powered Wall Plate With Plug Prongs" to Jeffrey P. Baldwin, filed Nov. 22, 2022, and issued as Utility U.S. Pat. No. 11,715, 918 on Aug. 1, 2023, which is a continuation of U.S. Utility patent application Ser. No. 17/168,949 entitled "Powered Wall Plate With Plug Prongs" to Jeffrey P. Baldwin, filed Feb. 5, 2021, and issued as Utility U.S. Pat. No. 11,509,102 on Nov. 22, 2022, which application claims the benefit of U.S. provisional patent application 63/023,362, filed May 12, 2020 to Jeffrey P. Baldwin, titled "Powered Wall Plate with Plug Prongs," the entirety of the disclosures of which are hereby incorporated by this reference. This application also claims the benefit of U.S. provisional patent application 63/471,474, filed Jun. 6, 2023, to Jeffrey P. Baldwin, titled "Powered Electrical Wall Plate with a Touch-Sensitive Surface," the entirety of the disclosure of which is hereby incorporated by this reference.

TECHNICAL FIELD

This document relates to a powered wall plate with a touch-sensitive surface for activating an LED light within the wall plate. More specifically, the document relates to a powered wall plate with a touch-sensitive surface where the powered wall plate is powered through either plug prongs or spring-biased contacts for the electrical device screws.

BACKGROUND

Wall plates are well known and are used to fill in the space between an electrical box and an electrical device. Specifically, the wall plates are known to provide a more aesthetically pleasing appearance while also preventing access to the electrical device. By preventing access to the electrical device, the user is safer because electrical wiring is not readily accessible.

SUMMARY

Aspects of this document relate to a powered wall plate, comprising a wall plate with at least two electrical plug prongs extending rearward from the wall plate, the wall plate having at least one opening configured to expose a first electrical receptacle of an electrical device therethrough, the at least two electrical plug prongs configured to removably mate with a second electrical receptacle of the electrical device, an electrical circuit located behind the wall plate and electrically coupled to the at least two electrical plug prongs, at least one light on the wall plate electrically coupled to the electrical circuit, and a touch-sensitive control switch electrically coupled to the at least one light and configured to control the supply of power from the electrical device to the at least one light, wherein the touch-sensitive control switch is configured to respond when a user contacts the touch-sensitive control switch.

Particular embodiments may comprise one or more of the following features. The touch-sensitive control switch may comprise a capacitive sensor. The touch-sensitive control switch may comprise a resistive sensor. The touch-sensitive control switch may comprise a piezoelectric sensor. The touch-sensitive control switch may be configured to change a brightness level of the at least one light. The touch-sensitive control switch may be configured to change a setting of the at least one light between an on setting in which the at least one light receives power from the electrical device, an off setting in which the at least one light is electrically isolated from the electrical device, and an auto setting in which the at least one light receives power from the electrical device when an ambient light level is lower than a threshold light level.

Aspects of this document relate to a powered wall plate, comprising a wall plate with at least two electrical plug prongs extending rearward from the wall plate, the wall plate having at least one opening configured to expose a first electrical receptacle of an electrical device therethrough, the at least two electrical plug prongs configured to receive power from the electrical device, an electrical circuit located behind the wall plate and electrically coupled to the at least two electrical plug prongs, at least one light on the wall plate electrically coupled to the electrical circuit, and a touch-sensitive control switch electrically coupled to the at least one light and configured to control the supply of power from the electrical device to the at least one light, wherein the touch-sensitive control switch is configured to respond when a user contacts the touch-sensitive control switch.

Particular embodiments may comprise one or more of the following features. The touch-sensitive control switch may comprise a capacitive sensor. The touch-sensitive control switch may comprise a resistive sensor. The touch-sensitive control switch may comprise a piezoelectric sensor. The touch-sensitive control switch may be configured to change a brightness level of the at least one light. The touch-sensitive control switch may be configured to change a setting of the at least one light between an on setting in which the at least one light receives power from the electrical device, an off setting in which the at least one light is electrically isolated from the electrical device, and an auto setting in which the at least one light receives power from the electrical device when an ambient light level is lower than a threshold light level.

Aspects of this document relate to a powered wall plate, comprising a wall plate with at least two electrical plug prongs extending rearward from the wall plate, the at least two electrical plug prongs configured to receive power from an electrical device, an electrical circuit electrically coupled to the at least two electrical plug prongs, at least one light on the wall plate electrically coupled to the electrical circuit, and a touch-sensitive control switch electrically coupled to the at least one light and configured to control the supply of power from the electrical device to the at least one light, wherein the touch-sensitive control switch is configured to respond when a user contacts the touch-sensitive control switch.

Particular embodiments may comprise one or more of the following features. The wall plate may have at least one opening configured to expose a first electrical receptacle of an electrical device therethrough. The electrical circuit may be located behind the wall plate. The touch-sensitive control switch may comprise a capacitive sensor. The touch-sensitive control switch may comprise a resistive sensor. The touch-sensitive control switch may comprise a piezoelectric sensor. The touch-sensitive control switch may be configured to change a brightness level of the at least one light. The touch-sensitive control switch may be configured to change a setting of the at least one light between an on setting in which the at least one light receives power from the electrical device, an off setting in which the at least one light is electrically isolated from the electrical device, and an auto setting in which the at least one light receives power from the electrical device when an ambient light level is lower than a threshold light level.

The foregoing and other aspects, features, and advantages will be apparent from the DESCRIPTION and DRAWINGS, and from the CLAIMS if any are included.

BRIEF DESCRIPTION OF THE DRAWINGS

Implementations will hereinafter be described in conjunction with the appended and/or included DRAWINGS, where like designations denote like elements, and.

DETAILED DESCRIPTION

Figure 1:
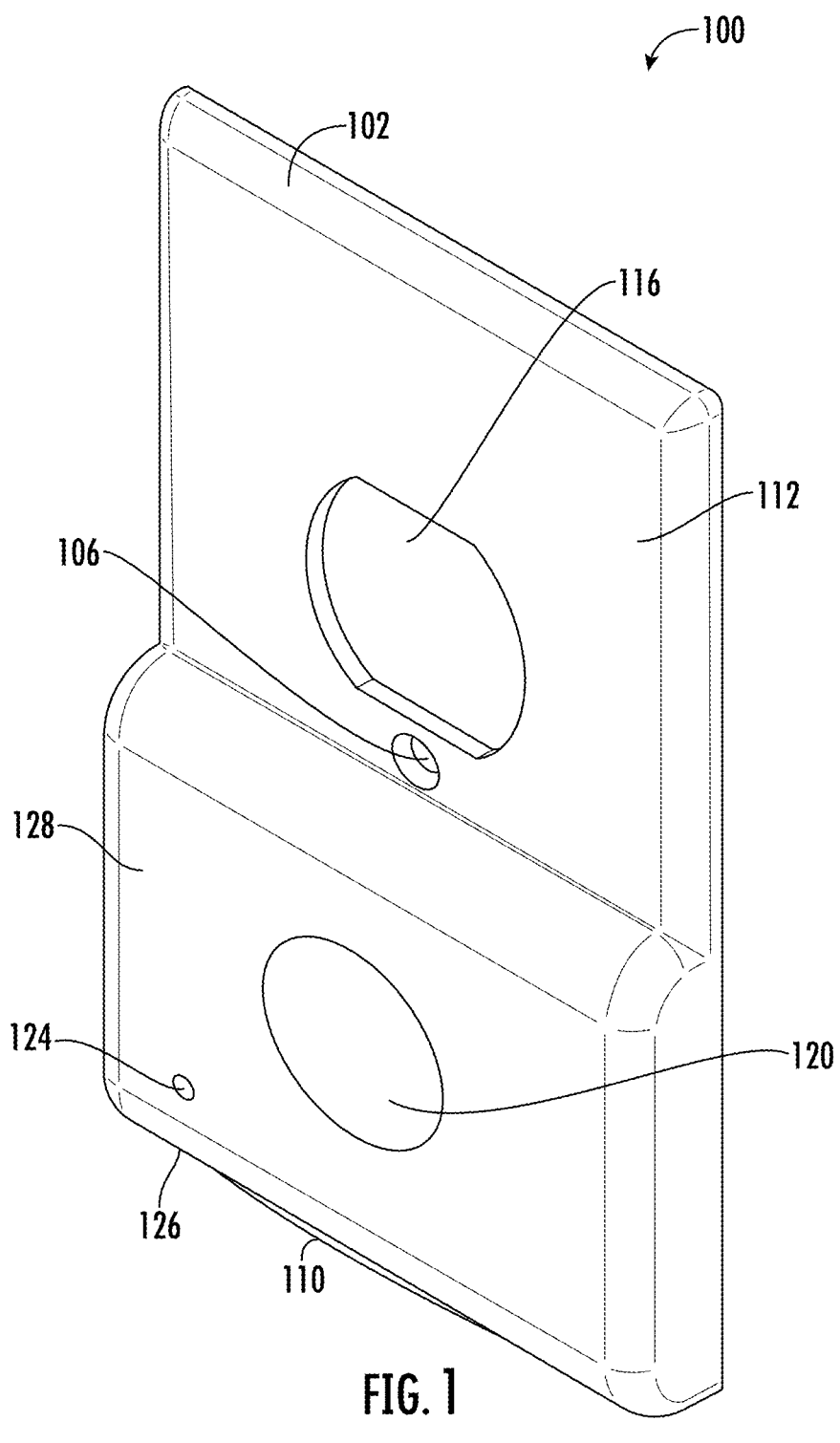
FIG. 1 is a perspective view of a powered wall plate with a touch-sensitive surface according to some embodiments.
Figure 2:
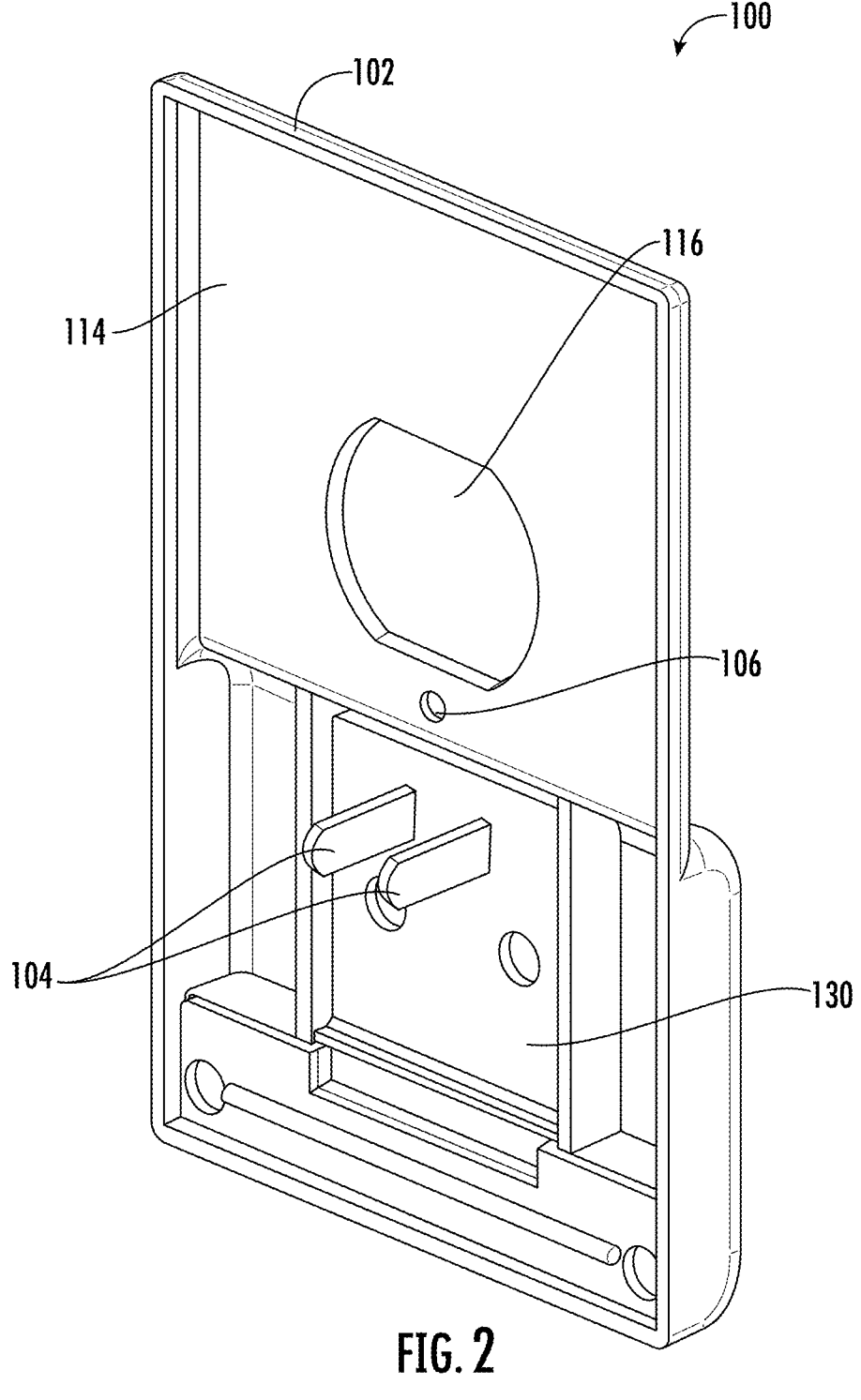
FIG. 2 is rear perspective view of a powered wall plate with a touch-sensitive surface according to some embodiments.
Figure 3:
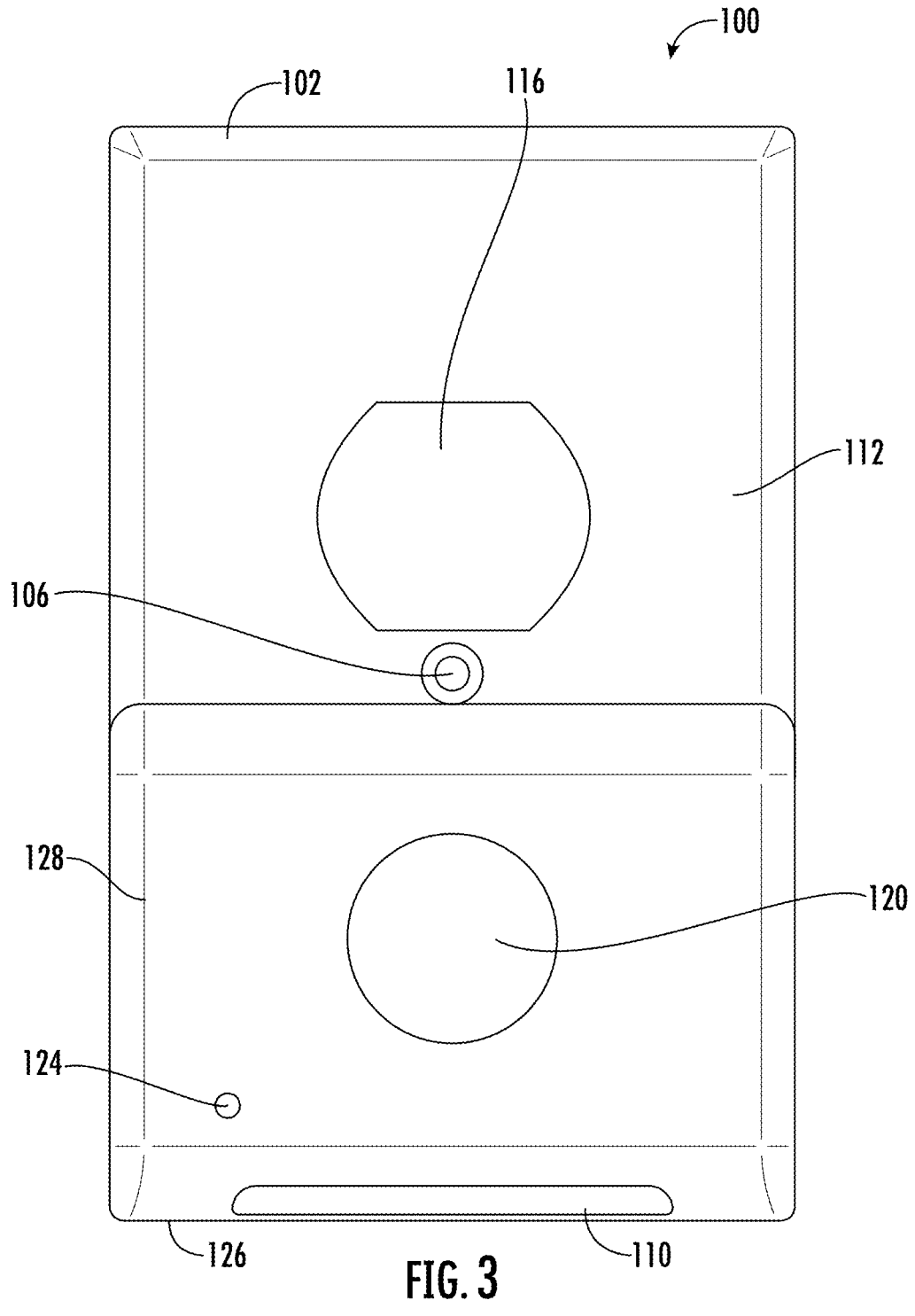
FIG. 3 is a front view of a powered wall plate with a touch-sensitive surface according to some embodiments.
Figure 4:
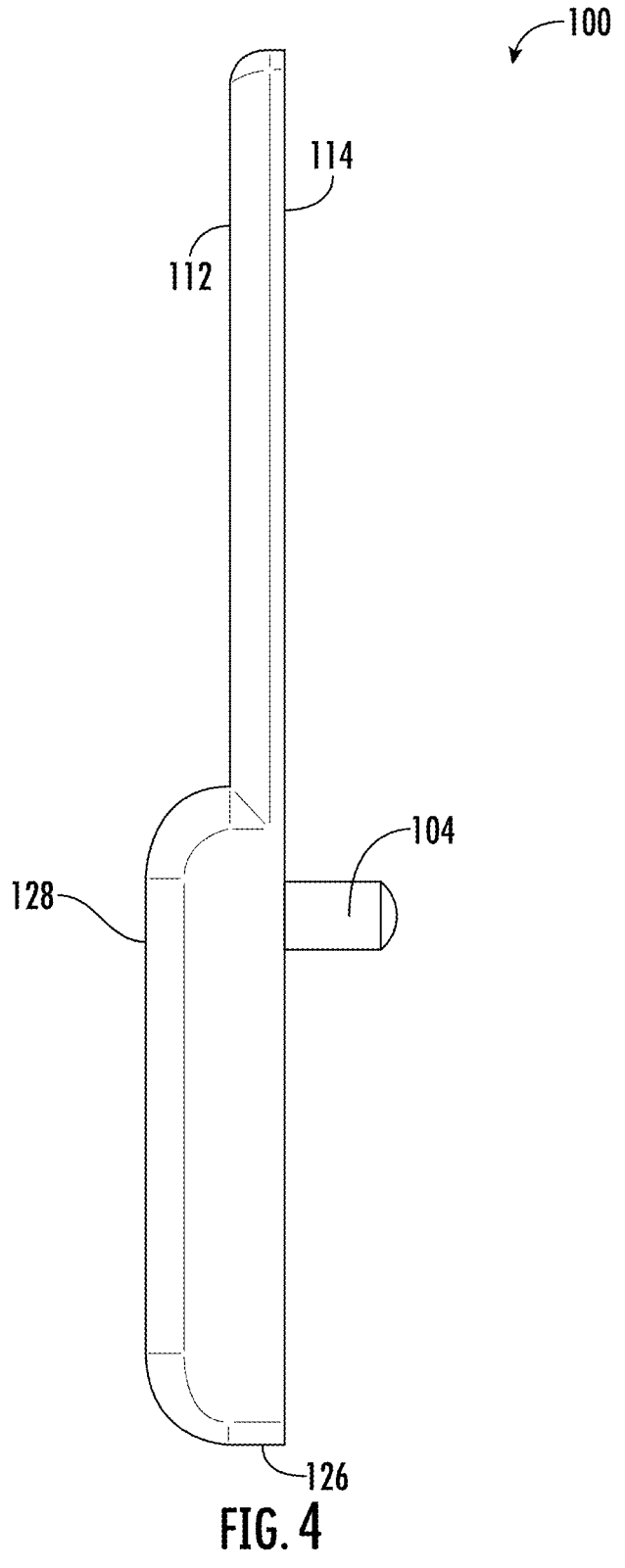
FIG. 4 is a side view of a powered wall plate with a touch-sensitive surface according to some embodiments.

Detailed aspects and applications of the disclosure are described below in the following drawings and detailed description of the technology. Unless specifically noted, it is intended that the words and phrases in the specification and the claims be given their plain, ordinary, and accustomed meaning to those of ordinary skill in the applicable arts.

In the following description, and for the purposes of explanation, numerous specific details are set forth in order to provide a thorough understanding of the various aspects of the disclosure. It will be understood, however, by those skilled in the relevant arts, that embodiments of the technology disclosed herein may be practiced without these specific details. It should be noted that there are many different and alternative configurations, devices and technologies to which the disclosed technologies may be applied. The full scope of the technology disclosed herein is not limited to the examples that are described below.

The singular forms "a," "an," and "the" include plural referents unless the context clearly dictates otherwise. Thus, for example, reference to "a step" includes reference to one or more of such steps.

The word "exemplary," "example," or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable.

Throughout the description and claims of this specification, the words "comprise" and "contain" and variations of the words, for example "comprising" and "comprises", mean "including but not limited to", and are not intended to (and do not) exclude other components.

As required, detailed embodiments of the present disclosure are included herein. It is to be understood that the disclosed embodiments are merely exemplary of the invention that may be embodied in various forms. Therefore, specific structural and functional details disclosed herein are not to be interpreted as limits, but merely as a basis for teaching one skilled in the art to employ the present invention. The specific examples below will enable the disclosure to be better understood. However, they are given merely by way of guidance and do not imply any limitation.

The present disclosure may be understood more readily by reference to the following detailed description taken in connection with the accompanying figures and examples, which form a part of this disclosure. It is to be understood that this disclosure is not limited to the specific materials, devices, methods, applications, conditions, or parameters described and/or shown herein, and that the terminology used herein is for the purpose of describing particular embodiments by way of example only and is not intended to be limiting of the claimed inventions. The term "plurality", as used herein, means more than one. When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable.

More specifically, this disclosure, its aspects and embodiments, are not limited to the specific material types, components, methods, or other examples disclosed herein. Many additional material types, components, methods, and procedures known in the art are contemplated for use with particular implementations from this disclosure. Accordingly, for example, although particular implementations are disclosed, such implementations and implementing components may comprise any components, models, types, materials, versions, quantities, and/or the like as is known in the art for such systems and implementing components, consistent with the intended operation.

The present disclosure is related to a powered wall plate 100. One embodiment of the powered wall plate 100 is illustrated in FIGS. 1-5. The powered wall plate 100 comprises a wall plate 102, at least two electrical plug prongs 104, at least one mounting screw aperture 106, an electrical circuit 108, and an electrical feature 110. The wall plate 102 has a front surface 112 opposite a rear surface 114. At least one opening 116 extends through the front surface 112 and the rear surface 114. The at least one opening 116 is sized to expose a first electrical receptacle 12 of an electrical device 10 therethrough. The at least two electrical plug prongs 104 extend rearward from the rear surface 114 and may originate within the wall plate 102. The at least two electrical plug prongs 104 are configured to removably mate with a second electrical receptacle 14 of the electrical device 10. Thus, when the at least two electrical plug prongs 104 are installed within the second electrical receptacle 14, the first electrical receptacle 12 is exposed through the at least one opening 116, and is accessible to an electrical plug.

The at least one mounting screw aperture 106 extends through the wall plate 102 and is configured to receive at least one mounting screw 118 (see FIG. 5) to attach the wall plate 102 to the electrical device 10. The wall plate 102 covers the gap between the electrical box and the electrical device 10. Thus, by attaching the powered wall plate 100 to the electrical device 10 with at least one mounting screw 118, the gap is more permanently covered, protecting users from accidental contact with the electrical wiring.

The electrical circuit 108 is located between the front surface 112 and the rear surface 114. In some embodiments, the electrical circuit 108 comprises a printed circuit board (see FIG. 5). The electrical circuit 108 is electrically coupled to the at least two electrical plug prongs 104. In particular embodiments, the at least two electrical plug prongs 104 are directly physically coupled to the electrical circuit 108. The electrical feature 110 is exposed on the wall plate 102, is electrically coupled to the electrical circuit 108, and is configured to receive power from the at least two electrical plug prongs 104 through the electrical circuit 108. The electrical feature 110 may be a light, such as an LED light, or a USB port. Alternatively, the electrical feature 110 may be a sensor, such as a temperature sensor, a motion sensor, a photocell configured to measure an ambient light level, or a smoke or carbon monoxide detector. The electrical feature 110 may also be a camera or some other electrical feature 110.

The powered wall plate 100 may additionally comprise a touch-sensitive control switch 120 configured to control the supply of power to the electrical feature 110. The touch-sensitive control switch 120 may be located on any surface of the wall plate 102. The touch-sensitive control switch 120 is configured to respond when a user contacts the touch-sensitive control switch 120. Thus, the touch-sensitive control switch 120 may act as a replacement for a button or mechanical control switch. The touch-sensitive control switch 120 may comprise a capacitive sensor, a resistive sensor, and/or a piezoelectric sensor. Similar to a mechanical control switch, the touch-sensitive control switch 120 may be configured to toggle the electrical feature 110 on and off, may be configured to change a setting of the electrical feature 110 between an on setting in which the electrical feature 110 receives power from the electrical device 10, an off setting in which the electrical feature 110 is electrically isolated from the electrical device 10, and an auto setting in which the electrical feature 110 receives power from the electrical device 10 when an ambient light level is lower than a threshold light level. The touch-sensitive control switch 120 may be configured to change a brightness level of the electrical feature 110 as well. More broadly, the touch-sensitive control switch 120 may be used to control the electrical feature 110 in any way.

When the auto setting is applied, the touch-sensitive control switch 120 selectively provides power to the electrical feature 110. For example, in embodiments where the electrical feature 110 is a light 122, the touch-sensitive control switch 120 applying the auto setting may selectively turn on the light 122 based on an ambient light level. The ambient light level may be measured by a photocell 124. The light 122 may be an LED light, and may be at least one light or a plurality of lights. In embodiments with a light 122, the powered wall plate 100 may also comprise a window 125 through the wall plate 102 which exposes the light 122 through the front surface 112. The light 122 may be located along a bottom edge 126 of the wall plate 102.

Figure 5:
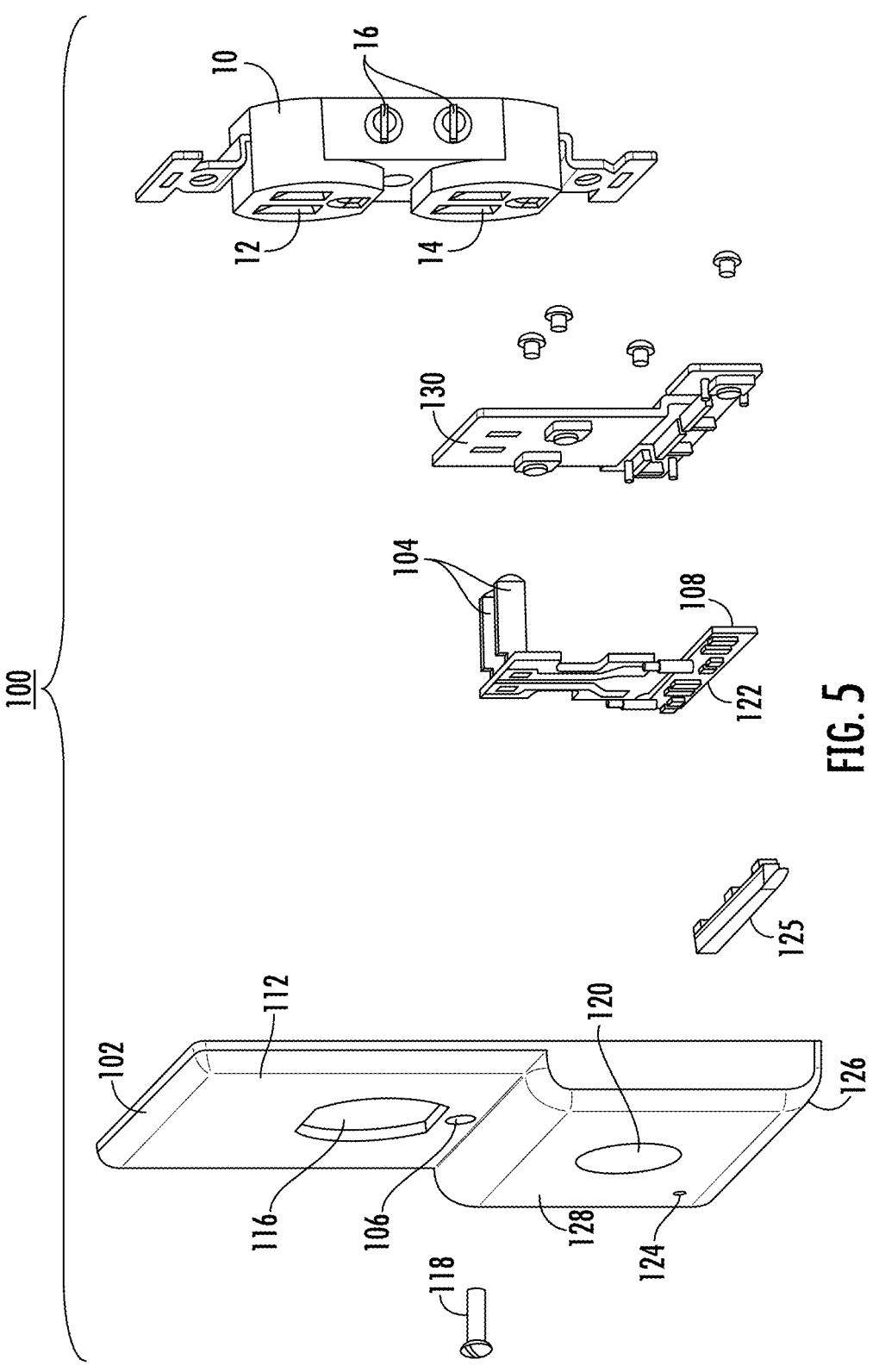
FIG. 5 is an exploded view of a powered wall plate with a touch-sensitive surface according to some embodiments.
Figure 6:
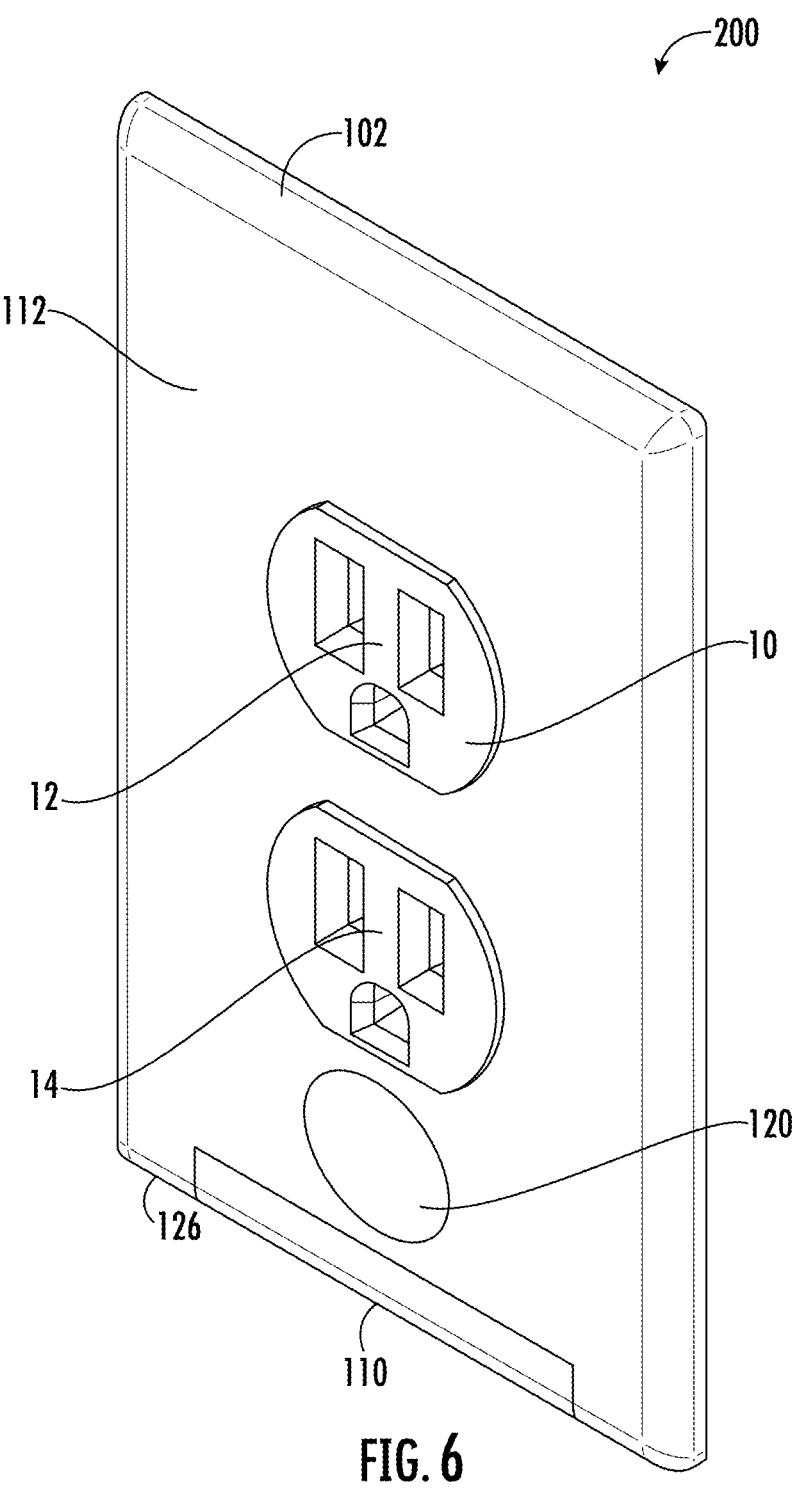
FIG. 6 is a perspective view of a powered wall plate with a touch-sensitive surface according to some embodiments.
Figure 7:
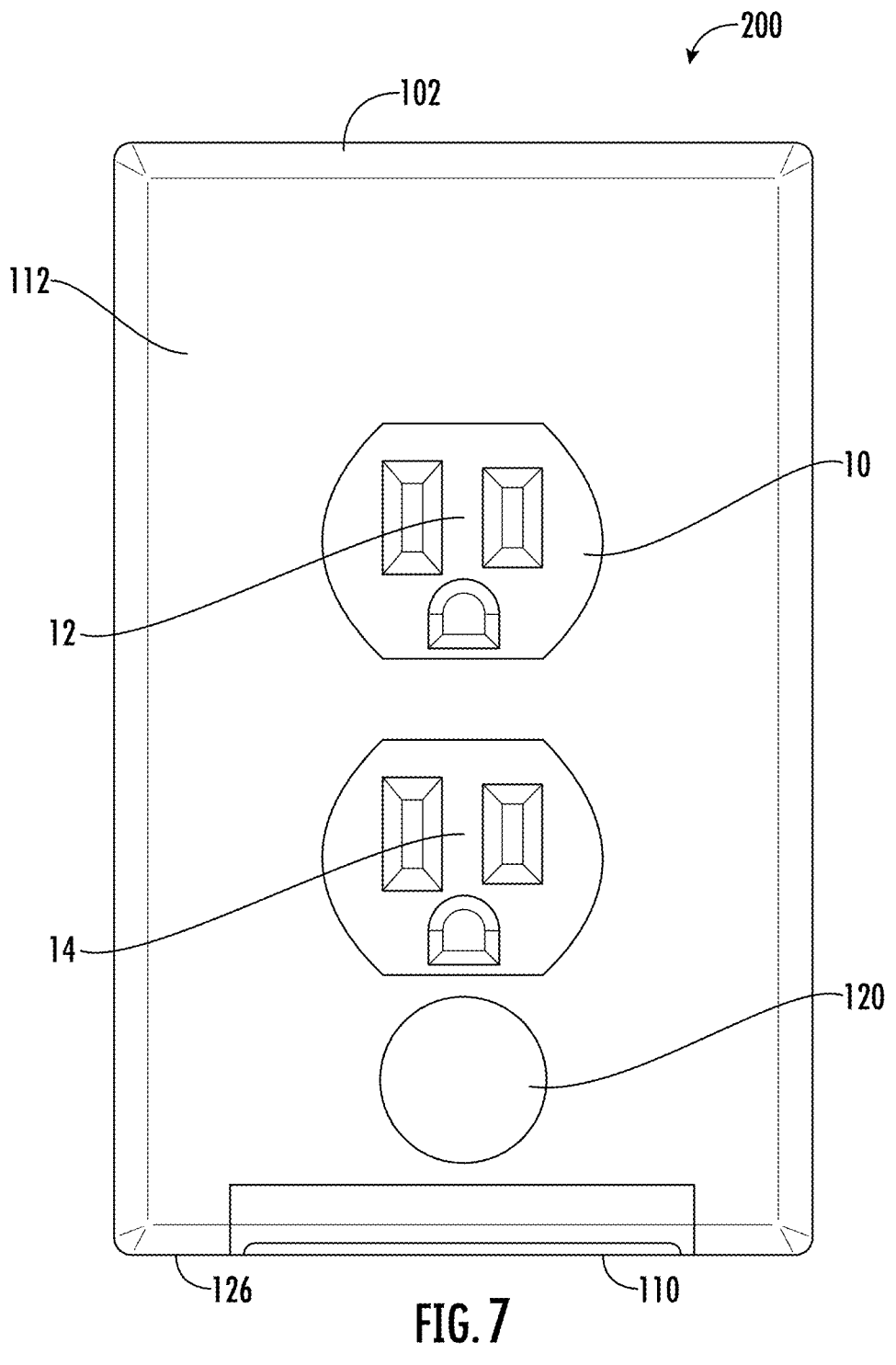
FIG. 7 is a front view of a powered wall plate with a touch-sensitive surface according to some embodiments.
Figure 8:
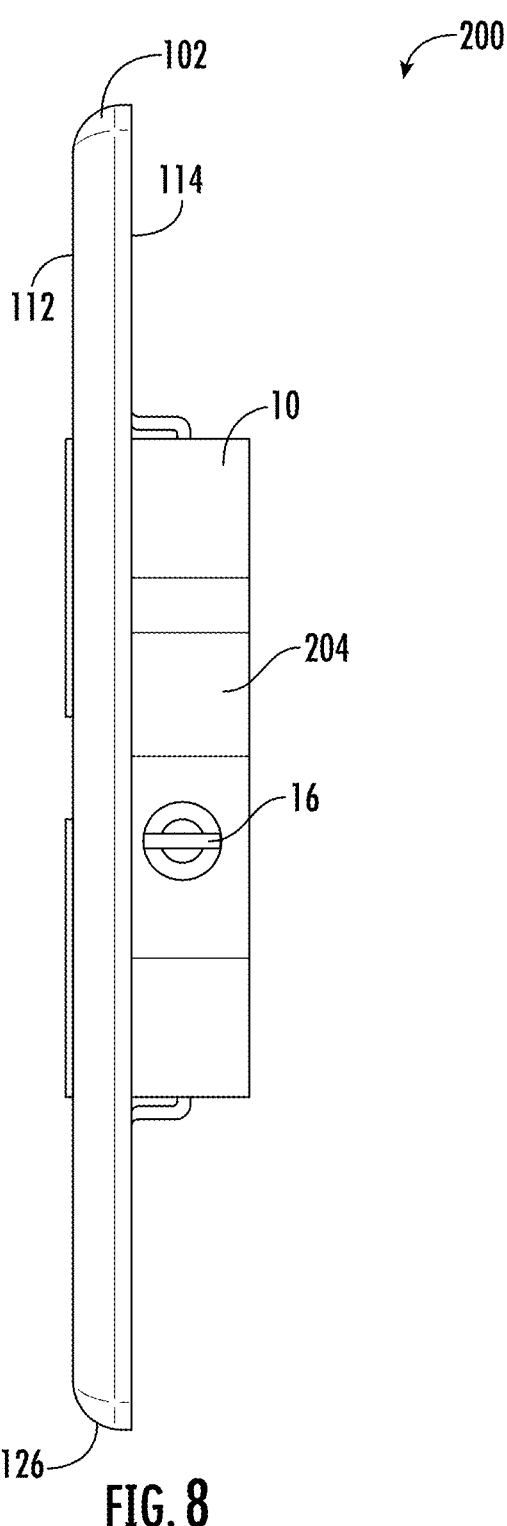
FIG. 8 is a side view of a powered wall plate with a touch-sensitive surface according to some embodiments.
Figure 9:
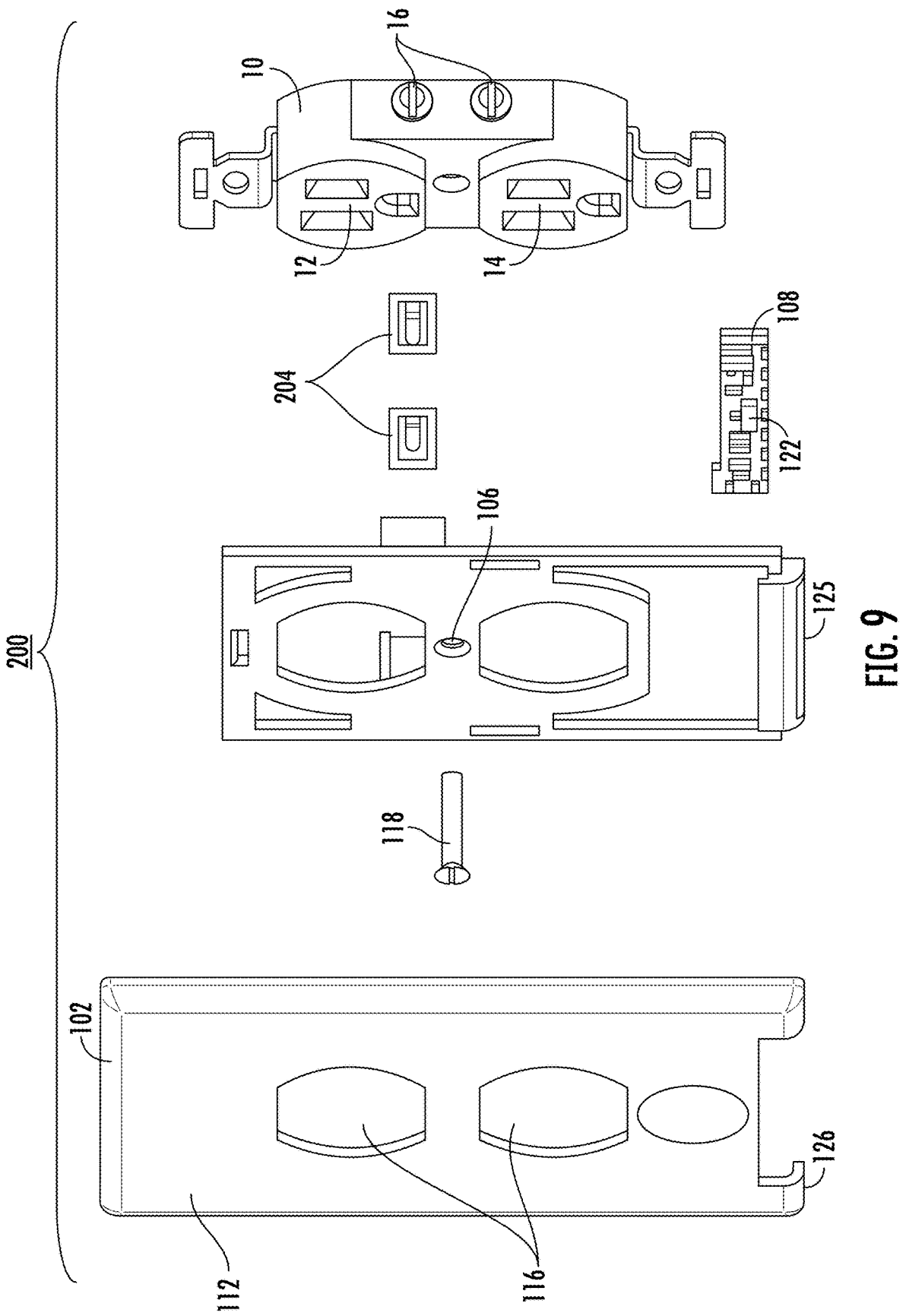
FIG. 9 is an exploded view of a powered wall plate with a touch-sensitive surface according to some embodiments.
Figure 10:
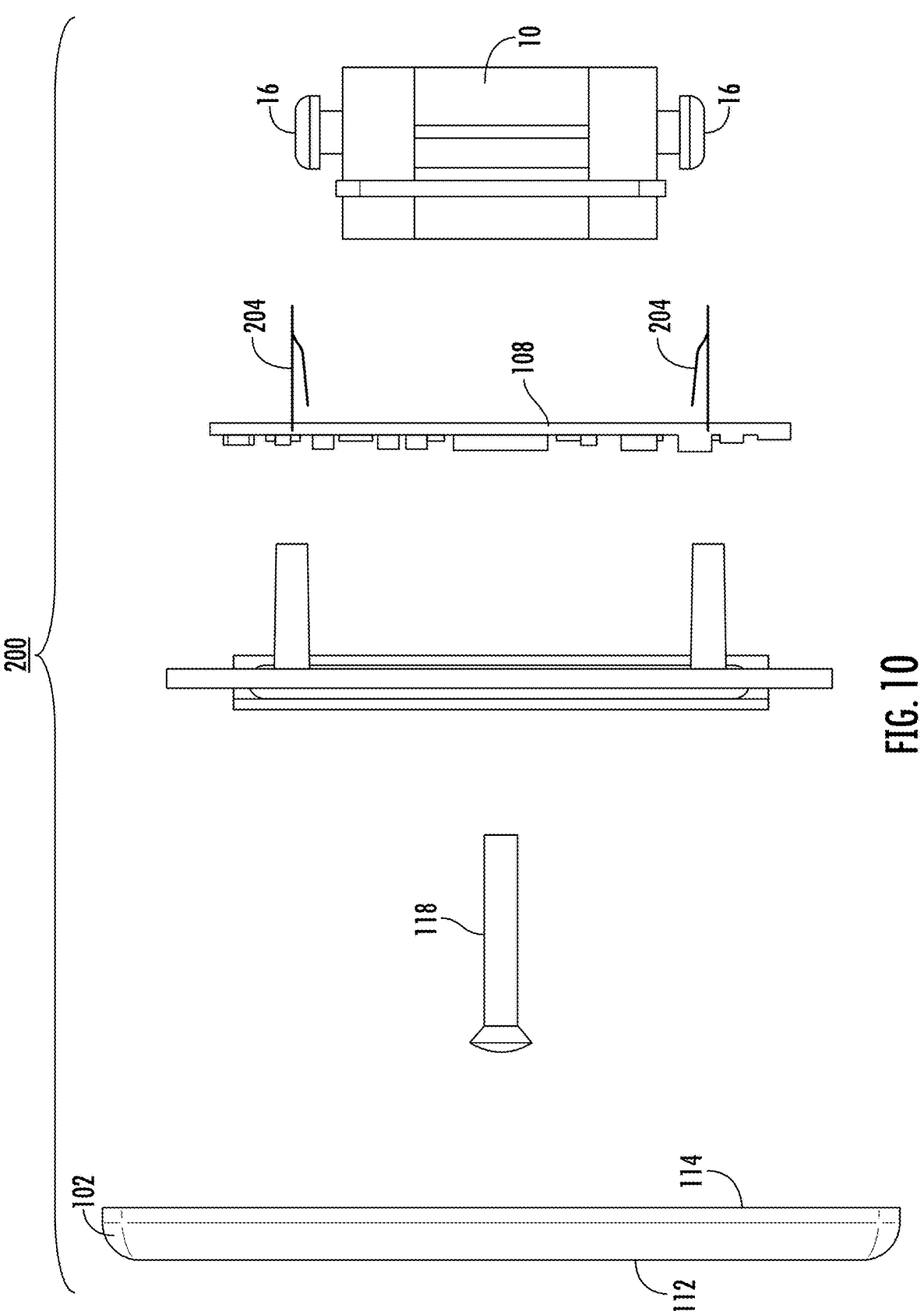
FIG. 10 is a side exploded view of a powered wall plate with a touch-sensitive surface according to some embodiments.

The wall plate 102 may have a protruding front face 128 extending forward of the front surface 112. In such embodiments, the photocell 124 may be exposed on the protruding front face 128 and the control switch 120 may be positioned on the protruding front face 128. In addition, the electrical circuit 108 may be located between the protruding front face 128 and the rear surface 114. The rear surface 114 may comprise a circuit back cover 130, which is removably coupled to the wall plate 102. For example, the circuit back cover 130 may be attached to the wall plate 102 with screws. The circuit back cover 130 is configured to cover the electrical circuit 108 when the circuit back cover 130 is installed on the wall plate 102, as shown in FIG. 5. The at least two electrical plug prongs 104 may extend through the circuit back cover 130.

The present disclosure is also related to a powered wall plate 200. One embodiment of the powered wall plate 200 is illustrated in FIGS. 6-10. The powered wall plate 200 may have any of the features discussed above with reference to the powered wall plate 100. The primary difference between the powered wall plate 200 and the powered wall plate 100 is that, when the powered wall plate 200 is mounted to an electrical device 10, the powered wall plate 200 has electrical plug prongs 204 which are configured to establish electrical contact with the electrical screws 16 located on the electrical device 10 (see FIG. 10). Thus, rather than drawing power from the first electrical receptacle 12 or the second electrical receptacle 14, the powered wall plate 200 is powered directly by the electrical screws 16. This allows both the first electrical receptacle 12 and the second electrical receptacle 14 to remain available for use with electrical plugs.

Many additional implementations are possible. Further implementations are within the CLAIMS.

It will be understood that implementations of the powered wall plate include but are not limited to the specific components disclosed herein, as virtually any components consistent with the intended operation of various powered wall plates may be utilized. Accordingly, for example, it should be understood that, while the drawings and accompanying text show and describe particular powered wall plate implementations, any such implementation may comprise any shape, size, style, type, model, version, class, grade, measurement, concentration, material, weight, quantity, and/or the like consistent with the intended operation of powered wall plates.

The concepts disclosed herein are not limited to the specific powered wall plates shown herein. For example, it is specifically contemplated that the components included in particular powered wall plates may be formed of any of many different types of materials or combinations that can readily be formed into shaped objects and that are consistent with the intended operation of the powered wall plate. For example, the components may be formed of: rubbers (synthetic and/or natural) and/or other like materials; glasses (such as fiberglass), carbon-fiber, aramid-fiber, any combination therefore, and/or other like materials; elastomers and/or other like materials; polymers such as thermoplastics (such as ABS, fluoropolymers, polyacetal, polyamide, polycarbonate, polyethylene, polysulfone, and/or the like, thermosets (such as epoxy, phenolic resin, polyimide, polyure-thane, and/or the like), and/or other like materials; plastics and/or other like materials; composites and/or other like materials; metals, such as zinc, magnesium, titanium, cop-per, iron, steel, carbon steel, alloy steel, tool steel, stainless steel, spring steel, aluminum, and/or other like materials; and/or any combination of the foregoing.

Furthermore, powered wall plates may be manufactured separately and then assembled together, or any or all of the components may be manufactured simultaneously and inte-grally joined with one another. Manufacture of these com-ponents separately or simultaneously, as understood by those of ordinary skill in the art, may involve 3-D printing, extrusion, pultrusion, vacuum forming, injection molding, blow molding, resin transfer molding, casting, forging, cold rolling, milling, drilling, reaming, turning, grinding, stamp-ing, cutting, bending, welding, soldering, hardening, rivet-ing, punching, plating, and/or the like. If any of the com-ponents are manufactured separately, they may then be coupled or removably coupled with one another in any manner, such as with adhesive, a weld, a fastener, any combination thereof, and/or the like for example, depending on, among other considerations, the particular material(s) forming the components.

In places where the description above refers to particular powered wall plate implementations, it should be readily apparent that a number of modifications may be made without departing from the spirit thereof and that these implementations may be applied to other implementations disclosed or undisclosed. The presently disclosed powered wall plates are, therefore, to be considered in all respects as illustrative and not restrictive.

We claim:

1. A powered wall plate, comprising:
a wall plate with at least two electrical plug prongs extending rearward from the wall plate, the wall plate having at least one opening configured to expose a first electrical receptacle of an electrical device there-through, the at least two electrical plug prongs config-ured to removably mate with a second electrical recep-tacle of the electrical device;
an electrical circuit located behind the wall plate and electrically coupled to the at least two electrical plug prongs;
at least one light on the wall plate electrically coupled to the electrical circuit; and
a touch-sensitive control switch electrically coupled to the at least one light and configured to control the supply of power from the electrical device to the at least one light through the electrical circuit coupled to the at least two electrical plug prongs, wherein the touch-sensitive control switch is configured to respond when a user contacts the touch-sensitive control switch.

2. The powered wall plate of claim 1, wherein the touch-sensitive control switch comprises a capacitive sensor.

3. The powered wall plate of claim 1, wherein the touch-sensitive control switch comprises a resistive sensor.

4. The powered wall plate of claim 1, wherein the touch-sensitive control switch comprises a piezoelectric sensor.

5. The powered wall plate of claim 1, wherein the touch-sensitive control switch is configured to change a brightness level of the at least one light.

6. The powered wall plate of claim 1, wherein the touch-sensitive control switch is configured to change a setting of the at least one light between an on setting in which the at least one light receives power from the electrical device, an off setting in which the at least one light is electrically isolated from the electrical device, and an auto setting in which the at least one light receives power from the electrical device when an ambient light level is lower than a threshold light level.

7. A powered wall plate, comprising:
a wall plate with at least two electrical plug prongs extending rearward from the wall plate, the wall plate having at least one opening configured to expose a first electrical receptacle of an electrical device there-through, the at least two electrical plug prongs config-ured to receive power from the electrical device;
an electrical circuit located behind the wall plate and electrically coupled to the at least two electrical plug prongs;
at least one light on the wall plate electrically coupled to the electrical circuit; and
a touch-sensitive control switch electrically coupled to the at least one light and configured to control the supply of power from the electrical device to the at least one light, wherein the touch-sensitive control switch is configured to respond when a user contacts the touch-sensitive control switch.

8. The powered wall plate of claim 7, wherein the touch-sensitive control switch comprises a capacitive sensor.

9. The powered wall plate of claim 7, wherein the touch-sensitive control switch comprises a resistive sensor.

10. The powered wall plate of claim 7, wherein the touch-sensitive control switch comprises a piezoelectric sensor.

11. The powered wall plate of claim 7, wherein the touch-sensitive control switch is configured to change a brightness level of the at least one light.

12. The powered wall plate of claim 7, wherein the touch-sensitive control switch is configured to change a setting of the at least one light between an on setting in which the at least one light receives power from the elec-trical device, an off setting in which the at least one light is electrically isolated from the electrical device, and an auto setting in which the at least one light receives power from the electrical device when an ambient light level is lower than a threshold light level.

13. A powered wall plate, comprising:
a wall plate with at least two electrical plug prongs extending rearward from the wall plate, the at least two electrical plug prongs configured to receive power from an electrical device;
an electrical circuit electrically coupled to the at least two electrical plug prongs;
at least one light on the wall plate electrically coupled to the electrical circuit; and
a touch-sensitive control switch electrically coupled to the at least one light and configured to control the supply of power from the electrical device to the at least one light, wherein the touch-sensitive control switch is configured to respond when a user contacts the touch-sensitive control switch.

14. The powered wall plate of claim 13, wherein the wall plate has at least one opening configured to expose a first electrical receptacle of an electrical device therethrough.

15. The powered wall plate of claim 13, wherein the electrical circuit is located behind the wall plate.

16. The powered wall plate of claim 13, wherein the touch-sensitive control switch comprises a capacitive sensor.

17. The powered wall plate of claim 13, wherein the touch-sensitive control switch comprises a resistive sensor.

18. The powered wall plate of claim 13, wherein the touch-sensitive control switch comprises a piezoelectric sensor.

19. The powered wall plate of claim 13, wherein the touch-sensitive control switch is configured to change a brightness level of the at least one light.

20. The powered wall plate of claim 13, wherein the touch-sensitive control switch is configured to change a setting of the at least one light between an on setting in which the at least one light receives power from the electrical device, an off setting in which the at least one light is electrically isolated from the electrical device, and an auto setting in which the at least one light receives power from the electrical device when an ambient light level is lower than a threshold light level.

\* \* \* \* \*